US011200120B2

(12) United States Patent
Milton et al.

(10) Patent No.: US 11,200,120 B2
(45) Date of Patent: *Dec. 14, 2021

(54) HYBRID MEMORY SYSTEM WITH CONFIGURABLE ERROR THRESHOLDS AND FAILURE ANALYSIS CAPABILITY

(71) Applicant: Netlist, Inc., Irvine, CA (US)

(72) Inventors: Scott H. Milton, Irvine, CA (US); Jeffrey C. Solomon, Irvine, CA (US); Kenneth S. Post, Newport Coast, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,210

(22) Filed: Jul. 19, 2019

(65) Prior Publication Data
US 2019/0340080 A1    Nov. 7, 2019

Related U.S. Application Data

(63) Continuation of application No. 14/214,652, filed on Mar. 14, 2014, now Pat. No. 10,372,551.
(Continued)

(51) Int. Cl.
*G06F 11/00* (2006.01)
*G06F 11/14* (2006.01)
(Continued)

(52) U.S. Cl.
CPC ........ *G06F 11/1458* (2013.01); *G06F 11/073* (2013.01); *G06F 11/076* (2013.01);
(Continued)

(58) Field of Classification Search
CPC .. G06F 11/1458; G06F 11/073; G06F 11/076; G06F 11/0793; G06F 11/3037;
(Continued)

(56) References Cited

U.S. PATENT DOCUMENTS 2,043,099 A    6/1936    Hanna
3,562,555 A    2/1971    Ahrons
(Continued)

FOREIGN PATENT DOCUMENTS

EP    2737383 A2    6/2014
TW    662552    6/2019
(Continued)

OTHER PUBLICATIONS

Chen, C. L. "Symbol error correcting codes for memory applications." In Fault Tolerant Computing, 1996., Proceedings of Annual Symposium on, pp. 200-207. IEEE, 1996. (Year: 1996).*
(Continued)

*Primary Examiner* — Anthony J Amoroso
(74) *Attorney, Agent, or Firm* — Vorys, Sater, Seymour & Pease, LLP (57) ABSTRACT

A system and method for configuring fault tolerance in nonvolatile memory (NVM) are operative to set a first threshold value, declare one or more portions of NVM invalid based on an error criterion, track the number of declared invalid NVM portions, determine if the tracked number exceeds the first threshold value, and if the tracked number exceeds the first threshold value, perform one or more remediation actions, such as issue a warning or prevent backup of volatile memory data in a hybrid memory system. In the event of backup failure, an extent of the backup can still be assessed by determining the amount of erased NVM that has remained erased after the backup, or by comparing a predicted backup end point with an actual endpoint.

12 Claims, 7 Drawing Sheets

Related U.S. Application Data (60) Provisional application No. 61/798,956, filed on Mar. 15, 2013, provisional application No. 61/799,271, filed on Mar. 15, 2013, provisional application No. 61/799,556, filed on Mar. 15, 2013.

(51) Int. Cl.
*G06F 11/07* (2006.01)
*G11C 16/34* (2006.01)
*G11C 29/42* (2006.01)
*G11C 29/44* (2006.01)
*G11C 29/04* (2006.01)

(52) U.S. Cl.
CPC ........ *G06F 11/0793* (2013.01); *G11C 16/349* (2013.01); *G11C 29/42* (2013.01); *G11C 29/44* (2013.01); *G11C 29/4401* (2013.01); *G11C 2029/0409* (2013.01); *G11C 2029/0411* (2013.01)

(58) Field of Classification Search
CPC ............. G06F 11/0727; G06F 11/1012; G06F 11/1048; G06F 11/106; G06F 12/0238; G06F 12/0246; G11C 16/349; G11C 29/42; G11C 29/44; G11C 29/4401; G11C 2029/0409; G11C 2029/0411
See application file for complete search history.

(56) References Cited

U.S. PATENT DOCUMENTS

| | | | |
|---|---|---|---|
| 3,916,390 A | 10/1975 | Chang et al. | |
| 4,234,920 A | 11/1980 | Van Ness et al. | |
| 4,420,821 A | 12/1983 | Hoffman | |
| 4,449,205 A | 5/1984 | Hoffman | |
| 4,965,828 A | 10/1990 | Ergott, Jr. et al. | |
| 5,430,742 A | 7/1995 | Jeddeloh et al. | |
| 5,519,663 A | 5/1996 | Harper, Jr. et al. | |
| 5,519,831 A | 5/1996 | Holzhammer | |
| 5,563,839 A | 10/1996 | Herdt et al. | |
| 5,577,213 A | 11/1996 | Avery et al. | |
| 5,619,644 A | 4/1997 | Crockett et al. | |
| 5,675,725 A | 10/1997 | Malcolm | |
| 5,870,350 A | 2/1999 | Bertin et al. | |
| 5,874,995 A | 2/1999 | Naimpally et al. | |
| 5,890,192 A | 3/1999 | Lee et al. | |
| 5,953,215 A | 9/1999 | Karabatsos | |
| 6,023,421 A | 2/2000 | Iadanza et al. | |
| 6,112,310 A | 8/2000 | Jun et al. | |
| 6,145,068 A | 11/2000 | Lewis | |
| 6,158,015 A | 12/2000 | Klein | |
| 6,199,142 B1 | 3/2001 | Saulsbury et al. | |
| 6,216,247 B1 | 4/2001 | Creta et al. | |
| 6,269,382 B1 | 7/2001 | Cabrera et al. | |
| 6,336,174 B1 | 1/2002 | Li et al. | |
| 6,336,176 B1 | 1/2002 | Leyda et al. | |
| 6,421,279 B1 | 7/2002 | Tobita et al. | |
| 6,459,647 B1 | 10/2002 | Kengeri | |
| 6,487,102 B1 | 11/2002 | Halbert et al. | |
| 6,487,623 B1 | 11/2002 | Emerson et al. | |
| 6,591,383 B1* | 7/2003 | Michel .................. H03M 13/09 714/704 |
| 6,658,507 B1 | 12/2003 | Chan | |
| 6,691,209 B1 | 2/2004 | O'connell | |
| 6,721,860 B2 | 4/2004 | Klein | |
| 6,769,081 B1 | 7/2004 | Parulkar | |
| 6,799,241 B2 | 9/2004 | Kahn et al. | |
| 6,799,244 B2 | 9/2004 | Tanaka et al. | |
| 6,816,982 B2 | 11/2004 | Ravid | |
| 6,839,774 B1* | 1/2005 | Ahn .................. G05B 19/0426 710/14 |
| 6,944,042 B2 | 9/2005 | Komatsuzaki | |
| 6,948,029 B2 | 9/2005 | Yano | |
| 6,952,368 B2 | 10/2005 | Miura et al. | |
| 7,053,470 B1 | 5/2006 | Sellers et al. | |
| 7,062,618 B2 | 6/2006 | Tsunoda et al. | |
| 7,089,412 B2 | 8/2006 | Chen | |
| 7,102,391 B1 | 9/2006 | Sun et al. | |
| 7,111,142 B2 | 9/2006 | Spencer et al. | |
| 7,155,627 B2 | 12/2006 | Matsui | |
| 7,200,021 B2 | 4/2007 | Raghuram | |
| 7,234,099 B2 | 6/2007 | Gower et al. | |
| 7,353,325 B2 | 4/2008 | Lofgren et al. | |
| 7,409,491 B2 | 8/2008 | Doblar et al. | |
| 7,409,590 B2 | 8/2008 | Moshayedi et al. | |
| 7,411,859 B2 | 8/2008 | Sohn et al. | |
| 7,421,552 B2 | 9/2008 | Long | |
| 7,467,251 B2 | 12/2008 | Park et al. | |
| 7,600,142 B2 | 10/2009 | Ichikawa | |
| 7,716,411 B2 | 5/2010 | Panabaker et al. | |
| 7,818,488 B2 | 10/2010 | Park et al. | |
| 7,921,339 B2* | 4/2011 | Chen .................. G06F 11/1068 714/54 |
| 8,060,797 B2* | 11/2011 | Hida .................. G06F 12/02 714/704 |
| 8,078,918 B2* | 12/2011 | Diggs .................. G06F 11/008 714/42 |
| 8,078,923 B2* | 12/2011 | Nagadomi .......... G06F 11/1068 714/706 |
| 8,086,955 B2 | 12/2011 | Zhou et al. | |
| 8,102,614 B2 | 1/2012 | Song et al. | |
| 8,233,303 B2 | 7/2012 | Best et al. | |
| 8,301,833 B1 | 10/2012 | Chen et al. | |
| 8,407,395 B2 | 3/2013 | Kim et al. | |
| 8,412,879 B2 | 4/2013 | Chang et al. | |
| 8,516,187 B2 | 8/2013 | Chen et al. | |
| 8,671,243 B2 | 3/2014 | Chen et al. | |
| 8,677,060 B2 | 3/2014 | Chen et al. | |
| 8,706,950 B2* | 4/2014 | Yano .................. G06F 3/064 711/103 |
| 8,874,831 B2 | 10/2014 | Lee et al. | |
| 8,880,791 B2 | 11/2014 | Chen et al. | |
| 8,904,098 B2 | 12/2014 | Amidi et al. | |
| 8,904,099 B2 | 12/2014 | Chen et al. | |
| 9,842,660 B1* | 12/2017 | Karamcheti ........... G06F 11/34 |
| 2002/0083368 A1 | 6/2002 | Abe et al. | |
| 2002/0199061 A1 | 12/2002 | Friedman et al. | |
| 2003/0158995 A1 | 8/2003 | Lee et al. | |
| 2004/0088508 A1 | 5/2004 | Ballard et al. | |
| 2004/0163027 A1 | 8/2004 | Maclaren et al. | |
| 2004/0190210 A1 | 9/2004 | Leete | |
| 2005/0044302 A1 | 2/2005 | Pauley et al. | |
| 2005/0060488 A1 | 3/2005 | Poechmueller | |
| 2005/0132250 A1 | 6/2005 | Hansen et al. | |
| 2005/0141273 A1 | 6/2005 | Park et al. | |
| 2006/0039197 A1 | 2/2006 | Khouri et al. | |
| 2006/0069896 A1 | 3/2006 | Sanders | |
| 2006/0080515 A1* | 4/2006 | Spiers ................ G06F 11/1441 711/162 |
| 2006/0220639 A1 | 10/2006 | Hyde | |
| 2006/0248411 A1* | 11/2006 | Kirscht .............. G06F 11/073 714/704 |
| 2006/0294295 A1 | 12/2006 | Fukuzo | |
| 2007/0124647 A1 | 5/2007 | Chen et al. | |
| 2007/0136523 A1 | 6/2007 | Bonella et al. | |
| 2007/0192627 A1 | 8/2007 | Oshikiri | |
| 2008/0104344 A1 | 5/2008 | Shimozono et al. | |
| 2008/0195806 A1 | 8/2008 | Cope | |
| 2009/0031099 A1 | 1/2009 | Sartore | |
| 2009/0144600 A1 | 6/2009 | Perlmutter et al. | |
| 2009/0217281 A1* | 8/2009 | Borkenhagen ...... G06F 11/1048 718/104 |
| 2009/0235038 A1* | 9/2009 | Sartore ............... G06F 12/0638 711/162 |
| 2009/0310408 A1* | 12/2009 | Lee .................... G11C 16/3431 365/185.03 |
| 2010/0122200 A1* | 5/2010 | Merry, Jr. ............ G11C 16/349 715/771 |
| 2010/0274953 A1 | 10/2010 | Lee et al. | |
| 2011/0099458 A1 | 4/2011 | Reche et al. | |
| 2011/0302445 A1 | 12/2011 | Byom et al. | |
| 2011/0320804 A1 | 12/2011 | Chan et al. | |

(56) References Cited

U.S. PATENT DOCUMENTS

| | | | | |
|---|---|---|---|---|
| 2012/0110417 | A1* | 5/2012 | D' Abreu | G06F 11/1012 714/773 |
| 2012/0151130 | A1 | 6/2012 | Merry, Jr. et al. | |
| 2012/0163097 | A1* | 6/2012 | Ishikawa | G11C 16/3431 365/185.25 |
| 2012/0204079 | A1 | 8/2012 | Takefman et al. | |
| 2012/0271990 | A1 | 10/2012 | Chen et al. | |
| 2012/0284587 | A1* | 11/2012 | Yu | G06F 3/0631 714/773 |
| 2013/0007542 | A1* | 1/2013 | Carman | G06F 11/106 714/710 |
| 2013/0019076 | A1 | 1/2013 | Amidi et al. | |
| 2013/0086309 | A1 | 4/2013 | Lee et al. | |
| 2013/0254456 | A1 | 9/2013 | Chen et al. | |
| 2013/0254497 | A1 | 9/2013 | Chen et al. | |
| 2013/0275836 | A1* | 10/2013 | Inada | G06F 11/1068 714/773 |
| 2014/0059170 | A1 | 2/2014 | Gasparakis et al. | |
| 2014/0156919 | A1 | 6/2014 | Chen et al. | |
| 2014/0156920 | A1 | 6/2014 | Chen et al. | |

FOREIGN PATENT DOCUMENTS

| | | |
|---|---|---|
| WO | 2013016723 A2 | 1/2013 |
| WO | 2014145311 A2 | 9/2014 |

OTHER PUBLICATIONS

"240pin DDR2 MetaSDRAM Registered DIMM based on 1 GB version C", Hynix Semiconductor, Product Description Rev. 0.2, Sep. 2008, 32 pages.

"MetaRAM Develops New Technology That Quadruples Memory Capacity of Servers and Workstations; Reduces Price by Up to 90 Percent", Press Release provided by MetaRAM and published on MarketWired.com, Feb. 25, 2008, 3 pages.

"Out of Stealth Mode, Start-Up MetaRAM Unveils New Technology That Quadruples DRAM Capacity", Press Release edited by Storage Newsletter on Feb. 28, 2008 at StorageNewsLetter.com, 8 pages.

"Using Two Chip Selects to Enable Quad Rank", an IP.com Prior Art Database Technical Disclosure, IP.com Electronic Publication: Dec. 17, 2005, 2 pages.

Advisory Action in U.S. Appl. No. 12/240,916, dated Mar. 13, 2012.
American National Standard Dictionary of Electrical and Electrical Terms, IEEE, Fourth Edition, Revised, ANS/IEEE Std 100-1988, Institute of Electrical Engineers, Nov. 3, 1988, pp. 215, 722, 964 and 1103.

Bruce, J., "Synchronous DRAM Architectures, Organizations, and Alternate Technologies", Electrical and Computer Engineering Dept., Univ. of Maryland, Dec. 10, 2002, 22 pages.

David, H. et al., "Fully Buffered DIMM (FB-DIMM) Design Considerations", Intel Developer Forum, Intel Corp., Feb. 18, 2004, 36 pages.

Diablo Technologies, Inc.'s Invalidity Contentions, Case No. 13-CV-05889 YGR, dated Jun. 6, 2014.

Horowitz, P. et al., "The Art of Electronics", Cambridge University Press 2nd Ed. 1989, pp. 471, 495-496.

Innis, J., "MPC8560 PowerQUICC III Compact Flash Interface Design", Freescale Semiconductor, Inc., 2004-2006, pp. 1-23.

International Preliminary Report on Patentability in PCT/US12/48750, dated Apr. 3, 2014.

International Search Report and Written Opinion filed in International patent application No. PCT/US2014/030050 dated Oct. 29, 2014.

International Search Report and Written Opinion in PCT/US12/48750, dated Oct. 10, 2012.

Jacob, B., "Memory Systems Cache, DRAM, Disk", Morgan Kaufman Publishers, Burlington, MA, 2008, Preface and Ch. 7 pp. 315-322.

Jandhyala, S. et al., "Design-For-Test Analysis of a Buffered SDRAM DIMM", Semiconductor Group, Texas Instruments, Proceedings of International Workshop in Memory Technology, Design and Testing, Singapore, Aug. 13014, 1996, 15 pages.

JEDEC Standard 21-C, "Configurations for Solid State Memories," pp. 4.5.5-1 to 4.5.5-18.

JEDEC Standard, "Configurations for Solid State Memories", JEDEC Standard 21-C, Release 9, Aug. 1999, 114 pages.

JEDEC Standard, Double Data Rate (DDR): SDRAM Specification: JESD79C (Revision JESD79B), Mar. 2003, pp. 1-75.

JEDEC Standard, FBDIMM Specification: DDR2 SDRAM Fully Buffered DIMM (FBDIMM) Design Specification: JESD205, JEDEC Solid State Tech. Assoc., Mar. 2007, pp. 1-129.

Mutnuary, B. et al., "Analysis of Fully Buffered DIMM Interface in High-speed Server Applications", IBM Corp, xSeries eServer Development, 2006 Electronic Components and Technology Conference, pp. 203-208.

Notice of Allowance in U.S. Appl. No. 14/214,652, dated May 7, 2019, 8 pages.

Notice of Allowance in U.S. Appl. No. 13/559,476, dated May 6, 2014.

Office Action in U.S. Appl. No. 12/240,916, dated Apr. 3, 2012.
Office Action in U.S. Appl. No. 12/240,916, dated Feb. 1, 2012.
Office Action in U.S. Appl. No. 12/240,916, dated Jul. 29, 2011.
Office Action in U.S. Appl. No. 13/536,173, dated Apr. 15, 2013.
Office Action in U.S. Appl. No. 13/625,563, dated Aug. 5, 2013.
Office Action in U.S. Appl. No. 13/625,563, dated May 9, 2014.
Office Action in U.S. Appl. No. 13/905,048, dated Aug. 1, 2013.
Office Action in U.S. Appl. No. 13/905,053, dated Aug. 1, 2013.
Office Action in U.S. Appl. No. 14/173,219, dated Mar. 13, 2014.
Office Action in U.S. Appl. No. 14/173,242, dated Mar. 14, 2014.
Office Action including European Search Opinion dated Sep. 5, 2016 of EU Patent Application No. 14 765 442.0.

Office Action including International Preliminary Report on Patentability dated Sep. 15, 2015 of PCT Application No. PCT/US20014/030050.

Office Action including Search Report dated Aug. 21, 2017 of Taiwanese Patent Application No. 103109905.

Office Action including written opinion dated Sep. 5, 2016 of Korean Patent Application No. 10-2015-7029205 with English translation.

Petition for Inter Partes Review of U.S. Pat. No. 8,301,833 (on behalf of SanDisk, Corp.), filed Jun. 20, 2014.

Petition for Inter Partes Review of U.S. Pat. No. 8,301,833 (on behalf of SMART Modular Technologies, Inc.), filed Aug. 22, 2014.

Petition for Inter Partes Review of U.S. Pat. No. 8,516,187 (on behalf of SanDisk, Corp.), filed Jun. 19, 2014.

Petition for Inter Partes Review of U.S. Pat. No. 8,516,187 (on behalf of SMART Modular Technologies, Inc.), filed Aug. 22, 2014.

Smart Storage Systems, Inc's Invalidity Contentions, Case No. 4:13-cv-05889-YGR, dated Jun. 6, 2014.

Webster's II New College Dictionary, Houghton Mifflin Company, Boston, MA, 2001, pp. 259, 1115.

Wong, A. "The BIOS Optimization Guide", Adrian's Rojak Pot, Rev. 6.2, 1998-2001, 67 pages.

* cited by examiner

FIG. 9

# HYBRID MEMORY SYSTEM WITH CONFIGURABLE ERROR THRESHOLDS AND FAILURE ANALYSIS CAPABILITY

This application is a continuation of U.S. patent application Ser. No. 14/214,652, filed Mar. 14, 2014, now U.S. Pat. No. 10,372,551, titled "HYBRID MEMORY SYSTEM WITH CONFIGURABLE ERROR THRESHOLDS AND FAILURE ANALYSIS CAPABILITY"; and claims the benefit of Provisional Patent Application No. 61/798,956, filed Mar. 15, 2013, titled "HYBRID MEMORY SYSTEM WITH CONFIGURABLE ERROR THRESHOLD PARAMETERS"; and claims the benefit of Provisional Patent Application No. 61/799,556, filed Mar. 15, 2013, titled "Method for Determining How Much Data was Saved in the Event of a Backup Failure in a Hybrid Memory System (HMS)"; and claims the benefit of Provisional Patent Application No. 61/799,271 filed Mar. 15, 2013, titled "METHOD TO ACCESS INCOMPLETE BACKUPS FOR HYBRID MEMORY SYSTEMS, the contents of all of which are incorporated herein by reference in their entirety.

TECHNICAL FIELD

The present disclosure relates generally to memory systems, and more particularly, to enhanced performance of memory systems such as hybrid memory systems having both volatile and non-volatile memory.

BACKGROUND

Hybrid memory systems are memory systems having a mixture of volatile and non-volatile memory types. Hybrid memory systems utilize non-volatile memory components to securely store volatile system data in the event of system fault or power failure, or upon user requests which may in include certain write or programming operations. Typically, the non-volatile memory used in a hybrid memory system is flash memory. The non-volatile memory components are made up of delimited memory portions, for example blocks, whose lifetimes are limited. Beyond these lifetimes, the memory portions can no longer be reliably used to store data, and any valid data present in them at that time may not be reliably accessed or recovered. Such reduced reliability of memory systems resulting in loss of data can be catastrophic to overall computer system performance or operation.

One type of non-volatile flash memory used in hybrid memory systems is NAND flash. NAND flash devices are available from several vendors and all share a similar architecture. Vendors of flash memory include Samsung™, Micron™, Hynix™, and Toshiba™.

Figure 1:
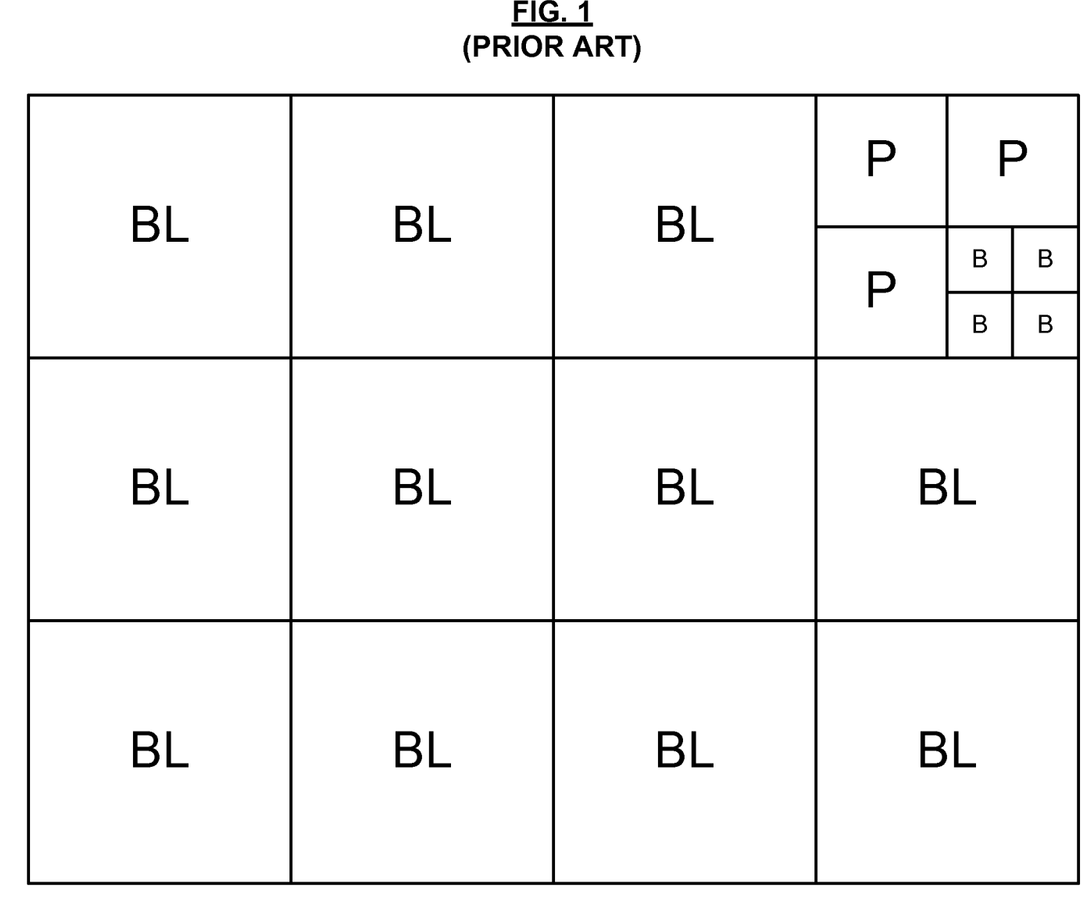
FIG. 1 schematic diagram of showing relationships of logical memory portions.

With reference to FIG. 1, the architecture of a NAND flash device is as follows:
  Each device is made up of (X) number of data blocks BL, which may be for example 8,192 in some applications. In FIG. 1, the memory device 100 is, for illustrative purposes only, comprised of 12 blocks (X=12);
  Each block BL is composed of (Y) number of pages P. Y may be 128 in some applications. Y=4 in FIG. 1—that is, 4 pages P per block, for a total of 4×12=48 pages, again for illustrative purposes only; and
  Each page is composed of (Z) number of bytes B, which may be for example 8,228 in some applications (4 schematically shown in FIG. 1, for illustrative purposes only).
The NAND flash device is programmed/written in units of pages. The NAND flash device is erased in units of blocks. If an uncorrectable error occurs in any page of a given block, the entire block is marked invalid.

Correctable and uncorrectable errors can be detected by the use of an error detection and correction algorithm. To insure data integrity, the data in the NAND flash device is typically protected by an error detection and correction algorithm.

One common approach to non-volatile memory management by memory systems, such as hybrid memory systems, is to mark blocks of memory invalid when uncorrectable errors are encountered under various circumstances. In particular, depending on the phase of operation—whether an error recovery can be performed—the error may or may not result in the loss of system data. Once an uncorrectable error occurs, a block is marked invalid.

Figure 2:
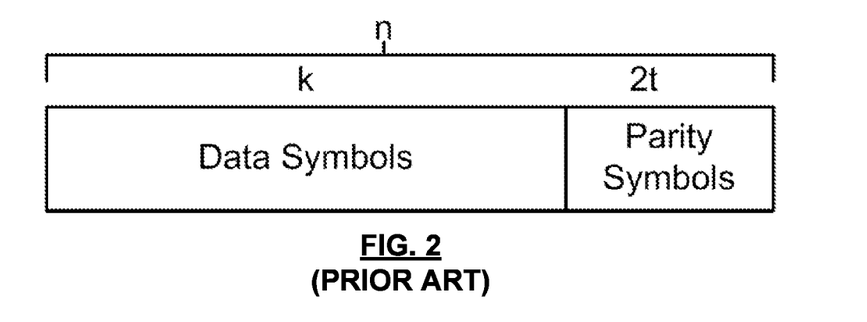
FIG. 2 is a schematic diagram for illustrating error detection and correction in a segment of memory.

With reference to FIG. 2, in general, many error detection and correction algorithms have the following properties:
  The algorithm operates on a segment of (n) symbols
  A symbol is specified by a number of bits (s)
  The algorithm computes and adds (2t) parity symbols to a set of (k) data symbols to create the segment (n): n=k+2t (symbols)
  The algorithm can detect (2t) symbol errors in (k) data symbols
  The algorithm can correct (t) symbol errors in (k) data symbols
  If the number of errors in a segment of (n) symbols exceeds the number that can be corrected (t), the error is uncorrectable, and the original data cannot be recovered.

There is a need for increasing the ability to control the reliability of non-volatile memory systems by determining or detecting when an uncorrectable error may occur and thus provide an early warning about the reliability of a portion of the non-volatile memory, for example a block or a page. Furthermore, there is a need to determine when there are too few non-volatile memory blocks to backup all of the specified or required data. Moreover, there is a need to provide the computer system or the end user a programmable capability to configure and customize certain thresholds for various parameters based on the desired reliability for the overall computer system, a particular application usage, or user level of risk tolerance for data errors.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of a memory system. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

The term "exemplary" when used herein is merely intended to mean "serving as an example, instance or illustration." Any embodiment described herein as "exemplary" is not necessarily to be construed as preferred or advantageous over other embodiments.

Described herein are methods and systems for managing and controlling the reliability of the non-volatile memory components of a hybrid memory system (HMS) based on user criteria, application based performance, or other parameters that can be fixed or programmable. In certain embodiments a mechanism for the computer system or an end user to manage and control when a portion of the non-volatile memory system (for example a block) is declared invalid and can no longer be a part of the non-volatile memory subsystem used to store data. In certain embodiments, there is provided the capability for setting one or more thresholds or parameters for the number of invalid blocks that can be reached before the hybrid memory system will issue a warning that a portion of (or all of) the hybrid memory system will be declared unusable. In this manner the end user can manage and control how a block, or any selected portion of the hybrid memory system, or all of the hybrid memory system, is removed from service in accordance with end user or computer system programmable preferences or specifications.

Figure 3:
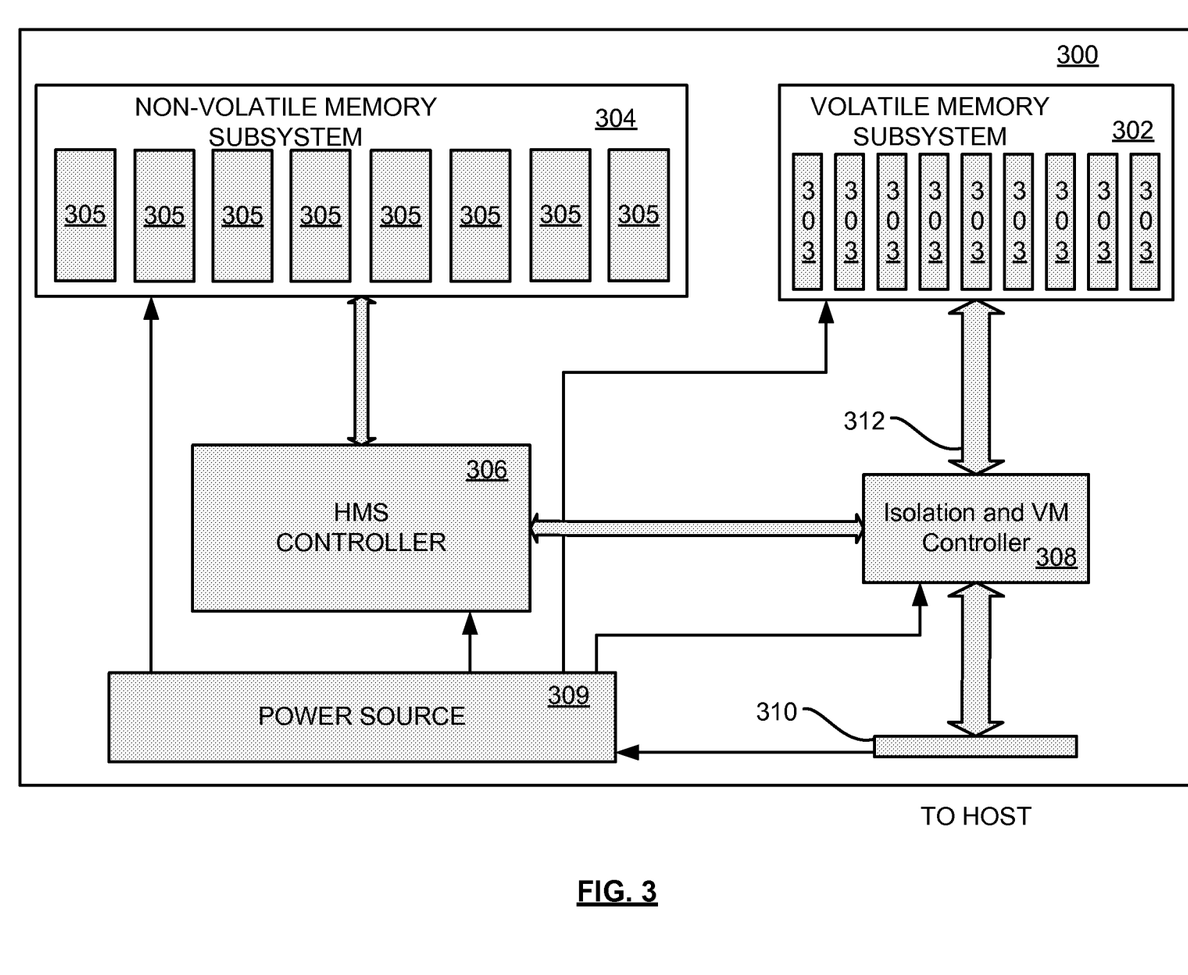
FIG. 3 is a block diagram of a hybrid memory system.

FIG. 3 is a block diagram of an example hybrid memory system (HMS) 300 in accordance with certain embodiments herein. HMS 300 can be coupled to a host computer system (not shown) and can include a volatile memory subsystem 302, a non-volatile memory subsystem 304, and an HMS controller 306 operatively coupled to the non-volatile memory subsystem 304. In certain embodiments, the memory system 300 includes at least one circuit 308 (Isolation and Volatile Memory Controller) configured to selectively operatively decouple the HMS controller 306 from the volatile memory subsystem 302 and/or the host. In such an arrangement, the circuit 308 electrically isolates HMS controller 306 and non-volatile memory subsystem 304 from the host, volatile memory subsystem 302, and bus 312, so that the host and volatile memory subsystem 302 can conduct data exchange with one another without interference or influence (for example capacitive loading) by the HMS controller 306 and non-volatile memory subsystem 304. The circuit 308 can also be configured to couples the HMS controller 306 and non-volatile memory subsystem 304 to the volatile memory subsystem 302, to the host, or to internal memory buffers within the circuit 308 so that data can be exchanged between the non-volatile memory subsystem 304 and any one or more of the volatile memory subsystem 302, the host, and the internal memory buffers within the circuit 308. In certain embodiments, the host is completely isolated from at least one of the volatile memory subsystem 302 and the non-volatile memory subsystem 304, and control and management of HMS 300 is conducted exclusively by HMS controller 306 and/or the circuit 308. In certain embodiments, the host is completely isolated from both the volatile memory subsystem 302 and the non-volatile memory subsystem 304, for example in response to a trigger condition, and HMS 300 functions autonomously and independently from the host, where the control and management of HMS 300 is conducted exclusively by HMS controller 306 and the circuit 308. In certain embodiments, a host memory access or a program operation is considered as a request and/or a manifestation of the trigger condition.

In certain embodiments, HMS 300 comprises a memory module, and may have a printed-circuit board (PCB) form factor. In certain embodiments, HMS 300 has a volatile memory capacity of 512-MB, 1-GB, 2-GB, 4-GB, 8-GB, 16-GB, 32-GB, and so on. Other volatile memory capacities are also compatible with certain embodiments described herein. In certain embodiments, HMS 300 has a volatile memory subsystem that is integrated within the circuit 308 such as using internal memory buffer to emulate the volatile memory subsystem 302, and can have various capacities of 16 MB, 32 MB, 64 MB, 128 MB, 256 MB, 512-MB, 1-GB, 2-GB and so on. In certain embodiments, HMS 300 has a volatile memory subsystem that is integrated within the HMS controller 306. In yet other embodiments, HMS 300 has a volatile memory subsystem and circuit 308 that are integrated within the HMS controller 306.

In certain embodiments, HMS 300 has a non-volatile memory capacity of 512-MB, 1-GB, 2-GB, 4-GB, 8-GB, 16-GB, 32-GB, 64-GB, 128-GB, 256-GB and so on, or any other number of memory capacity that is based on the overall system requirement. Other non-volatile memory capacities are also compatible with certain embodiments described herein. In addition, memory systems having widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the PCB of HMS 300 has an industry-standard form factor such as specified by JEDEC standards. For example, the PCB can have a low profile (LP) form factor with a height of 30 millimeters and a width of 133.35 millimeters. In certain other embodiments, the PCB 20 has a very high profile (VHP) form factor with a height of 50 millimeters or more. In certain other embodiments, the PCB has a very low profile (VLP) form factor with a height of 18.3 millimeters. Other form factors including, but not limited to, small-outline (SO-DIMM), unbuffered (UDIMM), registered (RDIMM), fully-buffered (FB-DIMM), miniDIMM, mini-RDIMM, VLP mini-DIMM, micro-DIMM, SRAM DIMM, and Ultra DIMM are also compatible with certain embodiments described herein. For example, in other embodiments, certain non-DIMM form factors are possible such as, for example, single in-line memory module (SIMM), multi-media card (MMC), and small computer system interface (SCSI).

In certain embodiments, HMS 300 is in electrical communication with the host system (not shown). In other embodiments, HMS 300 may communicate with a host system using some other type of communication, such as, for example, optical communication. Examples of host systems include, but are not limited to, blade servers, 1U servers, personal computers (PCs), and other applications in which the performance and reliability of the host is dependent on the performance and reliability of the non-volatile or volatile memory subsystems. In certain embodiments, HMS 300 is a memory module where the interface 310 is standard based DIMM interface as specified by JEDEC. In certain embodiments, HMS 300 is a hybrid memory module that appears to the computer system as a registered memory module (RDIMM). HMS 300 can be in communication with a disk controller of a computer system, for example. An interface 310 that is configured to be in electrical communication with the host system may be provided. For example, the interface 310 can comprise a plurality of edge connections which fit into a corresponding slot connector of the host system and/or be in full compliance with standard based electrical specification such as specified by JEDEC standards. For example, the interface 310 can comprise a standard DDR (e.g. DDR3 or DDR4) DIMM, RDIMM, or LRDIMM edge connector. The interface 310 of certain embodiments provides a conduit for power voltage as well as data, address, and control signals between HMS 300 and the host system. In certain embodiments, HMS 300 include a power source 309 that controls and distributes power to the HMS controller 306, the volatile memory subsystem 302, the circuit 308, and the non-volatile memory subsystem 304. The power source 309 may include energy storage devices, such as super capacitors, to be charged during normal operation drawing power from the host, while when the HMS 300 functions autonomously and independently from the host the power source 309 controls the power distribution to various subsystems or components of HMS 300. Certain functionality of power source 309 can be controlled or programmed by the host or the user in accordance with certain reliability or performance criteria. The power source 309 controls and performs as main power management controller and includes various subsystems such as DC-to-DC conversion in order to accommodate different portions of the HMS 300 that require different power (i.e. voltage and current) requirement.

The volatile memory subsystem 302 comprises one or more volatile memory elements 303 and the non-volatile memory subsystem 304 comprises one or more non-volatile memory elements 305. While the memory subsystems 302 and 304 are shown as physically comprised of discrete memory elements or devices 303, 305, respectively, it will be appreciated that logically, other delimitations and groupings are contemplated. Non-volatile memory subsystem 302 for instance is also comprised of memory portions that can be grouped, in increasing size order, into segments, pages, blocks, and slices of memory. An example of segment size is 242 bytes. An example of an ECC (error correction code) segment (explained below) size is 13 bytes. An example of a page size is 8,192 bytes. An example of a block size is 128 pages, or 1,048,576 bytes. Certain embodiments described herein advantageously provide non-volatile storage via the non-volatile memory subsystem 304 in addition to high-performance (e.g., high speed) storage via the volatile memory subsystem 302. In certain embodiments, the first plurality of volatile memory elements 303 comprises two or more dynamic random-access memory (DRAM) elements. Types of DRAM elements 303 compatible with certain embodiments described herein include, but are not limited to, DDR, DDR2, DDR3, and synchronous DRAM (SDRAM). The volatile memory elements 303 may comprise other types of memory elements such as static random-access memory (SRAM). In addition, volatile memory elements 303 having bit widths of 4, 8, 16, 32, as well as other bit widths, are compatible with certain embodiments described herein. Volatile memory elements 303 compatible with certain embodiments described herein have packaging which includes, but is not limited to, thin small-outline package (TSOP), ball-grid-array (BGA), fine-pitch BGA (FBGA), micro-BGA (1.1,BGA), mini-BGA (mBGA), and chip-scale packaging (CSP).

In certain embodiments, the plurality of non-volatile memory elements 305 comprises one or more flash memory elements. Types of flash memory elements 305 compatible with certain embodiments described herein include, but are not limited to, NOR flash, NAND flash, ONE-NAND flash, and multi-level cell (MLC). In addition, non-volatile memory elements 305 having bit widths of 4, 8, 16, 32, as well as other bit widths, are compatible with certain embodiments described herein. Non-volatile memory elements 305 compatible with certain embodiments described herein have packaging which include, but are not limited to, thin small-outline package (TSOP), ball-grid-array (BGA), fine-pitch BGA (FBGA), micro-BGA (PGA), mini-BGA (mBGA), and chip-scale packaging (CSP).

In terms of storage capacity, in order to account for invalid blocks, HMS 300 preferably contains more non-volatile memory 304 than the amount of volatile memory 302 that it needs to protect. For example, if there is (S) amount of volatile memory within the HMS, then S×F non-volatile memory is provided, wherein F is an over-provisioning factor based on system design requirements. In certain embodiments, HMS 300 contains double, triple or any multiple (integer or non-integer) amount of non-volatile memory to volatile memory. In certain embodiments, the over-provisioning factor F can be hundreds multiples, as an example the non-volatile memory capacity is 500 GB while the volatile memory capacity is 1 GB, 2 GB, or 4 GB.

Figure 4:
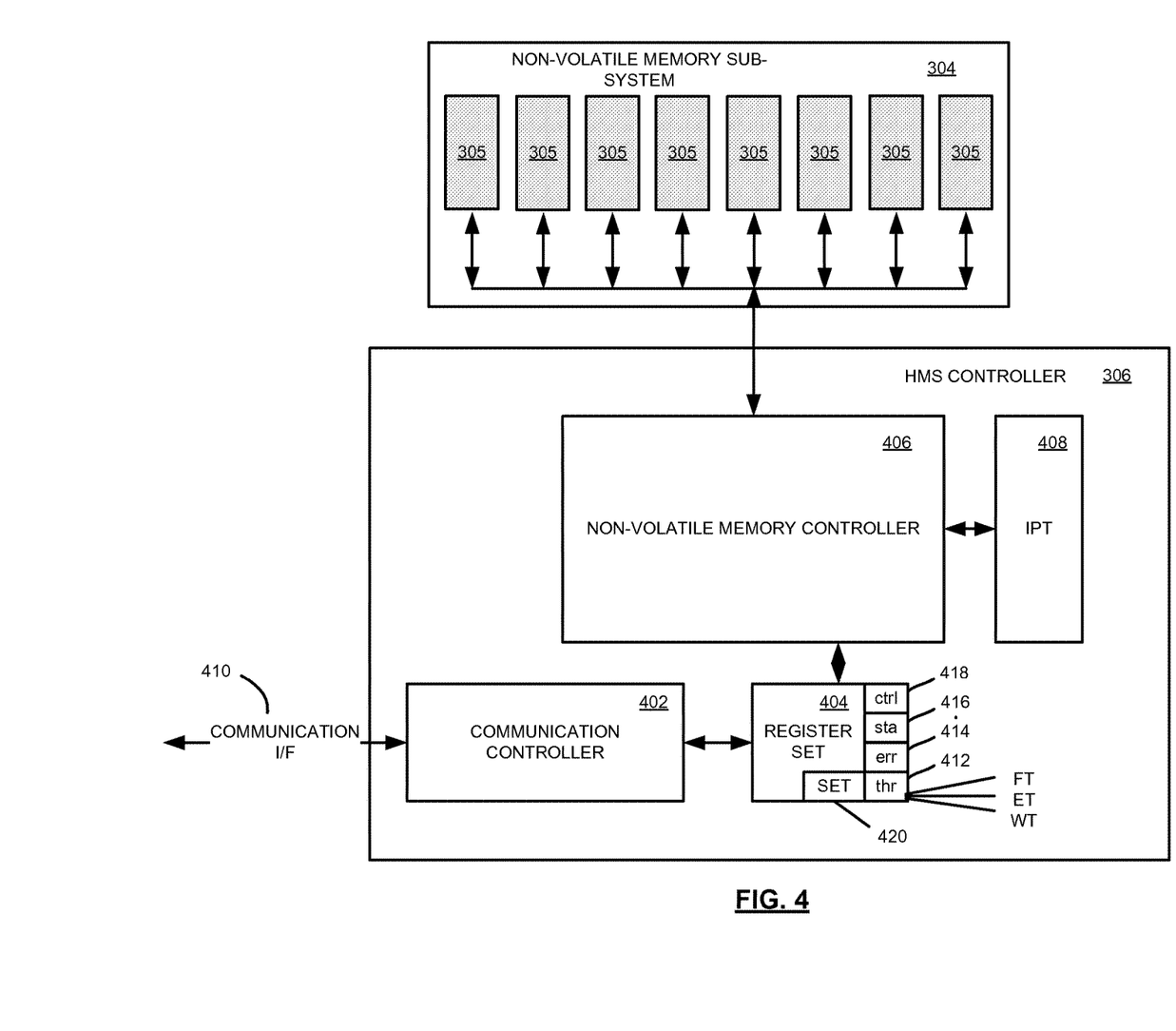
FIG. 4 is a block diagram showing a hybrid memory controller and with a non-volatile memory.

FIG. 4 is a block diagram showing more details of hybrid memory system (HMS) controller 306, which includes a communication controller 402, a communication controller register set 404, a non-volatile memory (NVM) controller 406, and an invalid portion table (IPT) 408. While shown as residing within the logic block of HMS controller 306, in certain embodiments IPT 408 and register set 404 may reside in external volatile or non-volatile memory, or in several such locations as duplicates.

IPT 408 is used by NVM controller to keep track of invalid non-volatile memory portions. These portions may be identified and managed in increments of segments, pages, blocks, or memory slices, as detailed below. Invalid designations of the memory may occur for any of various reasons, and may be functions of programmable or configurable error criteria and thresholds as detailed below. In one example, and not by way of limitation, NVM controller 406 may designate a block of non-volatile memory 304 invalid due to a manufacturing error in the block that prevents access to that block or portions thereof. In another example, operational errors, such as errors encountered during a read or write operation, can lead to declaring memory portions associated with the errors as invalid. In certain embodiments, memory portions are declared invalid when data errors are encountered, or when command response times associated with the portions exceed specified time out limits ("time out errors"). For example, if a read, program, or erase command does not complete within a predetermined length of time, then the corresponding block or blocks may be designated as invalid. In certain embodiments, during a memory program operation, if an error is detected, the portion of memory being programmed is marked invalid in IPT 408 and the data is written to the next valid block. In certain embodiments, during a read operation, if an error is detected, the memory portion, such as segment, page, block, or slice, being read is marked invalid in IPT 408.

Communication controller 402 is operable to receive configuration information from the user or the host system. Communication controller 402 is also operable to deliver HMS 300 status information to the user or host system. This two-way communication is by a messaging protocol conducted through communication interface 410. The messaging protocol is transmitted in certain embodiments over an electrical interface under the management of the communication controller 402.

The configuration information received by communication controller 402 through the messaging protocol and communication interface 410 is used for reading or writing the values of register set 404, which includes threshold registers 412, error registers 414, status registers 416, and control registers 418.

In certain embodiments, values written in threshold registers 412 define the parameters for declaring portions of non-volatile memory 304 invalid. With the ability to set the values in the threshold registers 412, the user or system can control and manage the amount of invalid non-volatile memory that will be tolerated, and the spectrum of actions and remediation measures that can be undertaken with progressive deterioration of memory health. In certain example embodiments, the user or system or application gains the ability to manage and control the amount of invalid non-volatile memory that will be tolerated before declaring that HMS 300, or portions thereof, has or is about to fail or become unreliable or unstable. In certain embodiments, the threshold registers 412 define threshold parameters that are configurable using default values, or are written into the registers, by way of the messaging protocol via communication interface 410 or by way of detection and learning by the NVM controller 406 over certain time period.

The set of threshold parameters can be thresholds that are at the memory segment level, page level, block level, slice level, system level or subsystem level. With reference to Table 1, at each level, three candidate thresholds are possible: a failure threshold (FT), an error threshold (ET), and a warning threshold (WT). The first column in Table 1 relates to the SET threshold, which is a configurable error criterion, detailed further below, that can relate to the number of errors that can occur before a portion of memory, such as a segment, page or block, is declared invalid. The remaining three columns in Table 1 relate to the number of invalid memory portions (segments, pages, or blocks) that can be tolerated before a subsuming memory portion (a page, block or slice) is declared invalid.

TABLE 1

| | LEVEL | | | |
|---|---|---|---|---|
| | SET | Page | Block | Slice |
| Warning Threshold (WT) | $WT_D$ | $WT_P$ | $WT_B$ | $WT_S$ |
| Error Threshold (ET) | $ET_D$ | $ET_P$ | $ET_B$ | $ET_S$ |
| Failure Threshold (FT) | $FT_D$ | $FT_P$ | $FT_B$ | $FT_S$ |

Considering the example of a block of the non-volatile memory 304, the number of invalid pages that will be tolerated before declaring a block invalid, or NVM controller 406 issuing warnings to that effect, e.g. to the host, is configurable by setting the thresholds $WT_B$, $ET_B$, and $FT_B$ in registers 412 using the communication protocol. In particular, the block failure threshold $FT_B$ indicates the maximum number of invalid pages per block that will be tolerated before a block is declared invalid. Thus a block can be considered invalid if more than $FT_B$ invalid pages are contained therein. Further, a page in such a determination can be considered invalid based on a configurable error criterion (SET column in Table 1), for example based on the occurrence of a user- or system-settable threshold number of errors per that page, or errors per segment within that page. The configurable error criterion is discussed further below. The block error threshold, $ET_B$, indicates the maximum number of invalid pages for a block to operate reliably in accordance with a specified application or user preference, where $ET_B \leq FT_B$. If $ET_B$ is exceeded, then an error is reported to the system and the system or user may choose that that block be declared invalid or to continue to use the block until the $FT_B$ threshold is reached. The block warning threshold $WT_B$, defines the number of invalid pages above which a warning will be reported to the system, with $WT_B \leq ET_B \leq FT_B$. The $WT_B$ is used to provide the end user with an early indication that the number of invalid pages per block has reached a critical level, e.g. the programmable threshold level, but that the HMS 300 may continue to operate in accordance with a specified application or user preference.

Considering the example of a slice of the non-volatile memory subsystem 304, or the non-volatile memory subsystem in its entirety, the number of invalid blocks therein that will be tolerated before declaring the slice, or the NVM subsystem in its entirety, invalid or no longer suitable for backup purposes, or for issuing warnings to that effect, is configurable by setting the thresholds $WT_S$, $ET_S$, and $FT_S$ in registers 412 using the communication protocol. In particular, the slice failure threshold $FT_S$ indicates the maximum number of invalid blocks per slice (or entire NVM subsystem) that will be tolerated before declaring the slice, or entire NVM subsystem, unsuitable or unreliable for data storage purposes. Thus a slice can be considered invalid if more than $FT_S$ invalid blocks are encountered therein. A block, in turn, can be considered invalid based on a configurable error criterion (SET column in Table 1), for example based on the occurrence of a user- or system-settable threshold number of errors per that block, or, as described above, based on a threshold number of invalid pages per that block.

The slice error threshold, $ET_S$, indicates the maximum number of invalid blocks for a slice to operate reliably in accordance with a specified application or user preference, where $ET_S \leq FT_S$. If $ET_S$ is exceeded, then an error is reported to the system and the system or user may choose that that slice be declared invalid or to continue using that slice until the $FT_S$ threshold is reached. The slice warning threshold $WT_S$ defines the number of invalid blocks above which a warning will be reported to the system, with $WT_S \leq ET_S \leq FT_S$. The $WT_S$ is used to provide the end user with an early indication that the number of invalid blocks has reached a critical level, but that the HMS 300 may continue to operate in accordance with a specified application or user preference. Thus if the slice is taken to be large enough relative to the data that is to be stored, the thresholds $WT_S$, $ET_S$, and $FT_S$ can signify the points at which reliability of the slice has fallen below the programmed threshold, storing data in the slice will no longer be possible and can produce errors that may or may not be correctable, and failure threshold for the slice has been reached and data storage should no longer be attempted to the slice, respectively. Thus, these early indications can be issued to the user or system by the NVM controller 406, and/or are used by the NVM controller 406 to effectively control and manage the memory space in-use that meets the default system or user specified criteria for storing data in the non-volatile memory 304.

Considering the example of a page of the non-volatile memory 304, thresholds $WT_P$, $ET_P$, and $FT_P$ are values, written into threshold registers 412 using the communication protocol, that relate to and define the number of invalid segments per page that can be tolerated. The page failure threshold $FT_P$ indicates the maximum number of invalid segments tolerable before a page is declared unusable or invalid. A page (or block or a slice) can be considered invalid based on a configurable error criterion (SET column in Table 1), for example based on the occurrence of a user- or system-settable threshold number of errors per that page. The page error threshold, $ET_P$, indicates the maximum number of invalid segments for a page to operate reliably in accordance with a specified application or user preference, where $ET_P \leq FT_P$. If $ET_P$ is exceeded, then an error is reported to the system and the user or system may choose that the application be terminated or to continue to operate until the threshold $FT_P$ is reached. The page warning threshold $WT_P$, defines the number of invalid segments above which a warning will be reported to the system, with $WT_P \leq ET_P \leq FT_P$. The $WT_P$ is used to provide the end user with an early indication that the number of invalid segments has reached a critical level.

Figure 5:
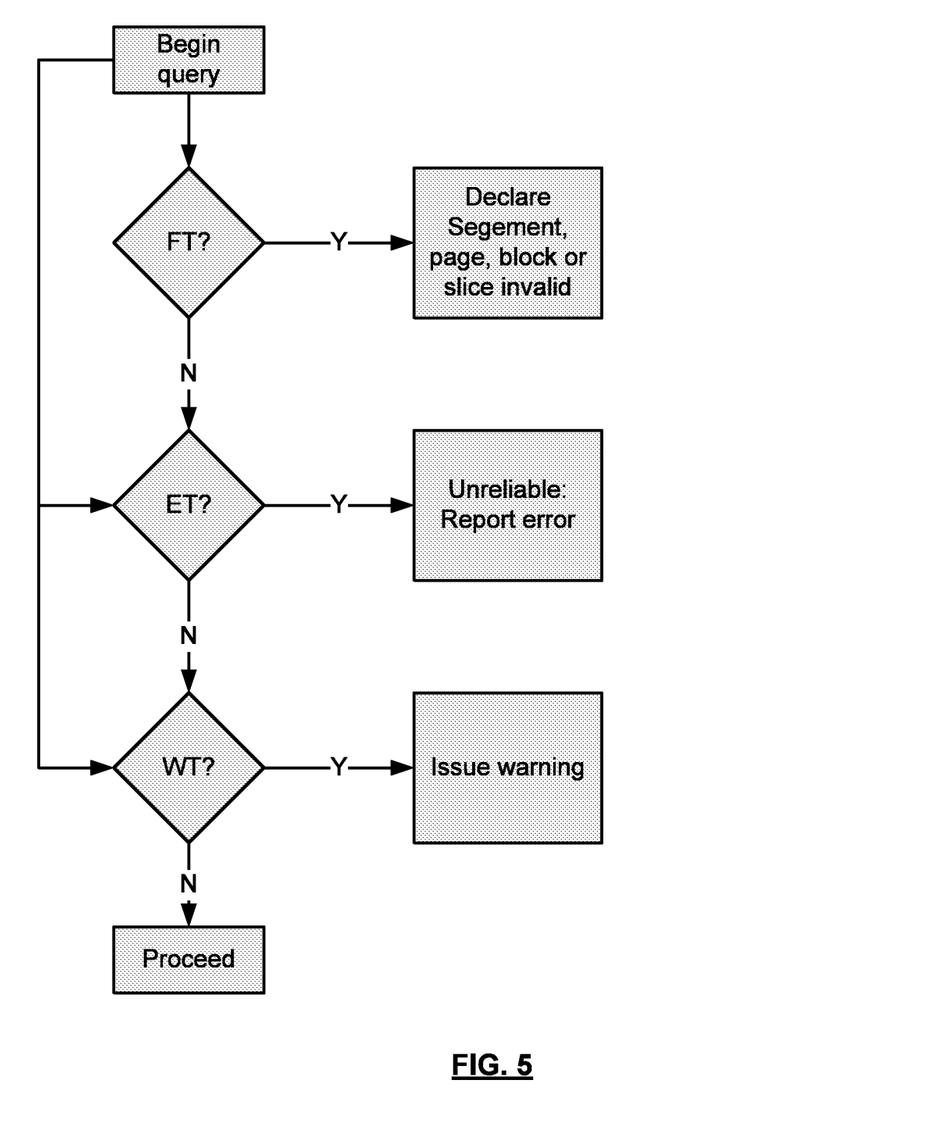
FIG. 5 is a flow diagram of a query process showing relationships among various thresholds.

FIG. 5 is schematic diagram showing the flow and relationship among the aforementioned thresholds. A system query (could be automatically initiated by system or an application, or manually initiated by a user interface) is invoked to determine whether any one or more of the failure thresholds, error thresholds, and warning thresholds of the non-volatile memory 304—as described above and in Table 1—is reached, and thus issue an indication, warning, or respond to the query initiator with the thresholds being reached or not.

Referring to FIG. 4, the Status register 416 and error register 414 in register set 404 may be utilized to communicate the HMS 300 status to host, the application, or the end user, also by way of the messaging protocol and communication interface 410. Error register 414 contains a bit or set of bits to indicate any error condition or a combination of error conditions of the non-volatile memory 304. For example, when any of the error thresholds (collectively, ET) are exceeded, an error bit or a set of bits is set in error register 414. Similarly, error register 414 contains a bit or set of bits to indicate the failure conditions discussed above. When any one or more of failure thresholds (collectively, FT) are exceeded, a failure bit or a set of bits is set in the error register 414. Status register 416 contains a bit or set of bits to indicate the warning conditions discussed above. When any one or more of warning thresholds (collectively, WT) are exceeded, a warning bit or a set of bits is set in the status register 416.

Control register 418 stores control information, such as the manner in which data is exchanged between the non-volatile memory 304 and the host or the volatile memory 302, e.g. data write or read from/to non-volatile memory 304, a backup operation initiated, the extent of the backup necessary, and so on.

In certain embodiments, the thresholds in register 418 can be specified by the number of valid non-volatile memory portions with corresponding minimum failure, error, and warning thresholds. Furthermore, the thresholds can also be specified as a percentage value of the overall capacity of the hybrid memory system (HBS) 300, or any other means to indicate a user or system preference.

It will be recalled that, in general, certain error detection and correction algorithms have the following properties:
  The algorithm operates on a segment of (n) symbols
  A symbol is specified by a number of bits (s)
  The algorithm computes and adds (2t) parity symbols to
    a set of (k) data symbols to create the segment (n):
    n=k+2t (symbols)
  The algorithm can detect (2t) symbol errors in (k) data
    symbols
  The algorithm can correct (t) symbol errors in (k) data
    symbols
  If the number of errors in a segment of (n) symbols exceeds the number that can be corrected (t), the error is uncorrectable, and the original data cannot be recovered.

As explained above, in certain embodiments, an error criterion can be configurable by the user or system (see first column of Table 1). This error criterion can for example relate to the number of correctable errors that can occur before a portion of memory is declared invalid. In this manner, for example, a symbol error threshold, SET (420), relating to an acceptable number of symbol errors per segment, per page, per block, or per slice, of NVM, can be set. In certain embodiments, SET is set to a value between one (1) and the maximum number of symbol errors that can be detected (2t) or corrected (t). When the number of symbol errors detected in a segment, page, block, or slice, that segment, page, block or slice is declared invalid. At the block level, therefore, and by way of example only, by configuring the symbol error threshold SET, the end user or system can control how many symbol errors are required to mark a block invalid. This ability of a user to control the performance of the HMS 300 reduces the probability of data loss by marking blocks invalid before enough symbol errors have accumulated to create an uncorrectable error. Thus, improving the reliability and performance of the overall computer system utilizing the HMS 300.

There are many possible sets of warning error and failure thresholds based on the number of detected errors. Threshold parameters can relate to: the number of symbol errors per segment that can be tolerated before warning or declaring that a segment or page is unstable or unusable; the number of symbol errors per segment or page that can be tolerated before warning or declaring that a block is unstable or unusable; the number of symbol errors per segment or page or block that can be tolerated before warning or declaring that a non-volatile memory system, a slice of the non-volatile memory system, or hybrid memory system 300 as a whole is unstable or unusable for data storage or backup purposes. Specifically, the thresholds can include: Total number of symbol errors per segment, with warnings and errors displayed on a per segment basis; total number of segments in a page having more than the threshold of symbol errors, with warnings and errors displayed on a per page basis; total number of pages in a block with segments having more than the threshold of symbol errors, with warnings and errors displayed on a per block basis; and total number of blocks having more than the threshold of pages with (E) symbol errors where (E) is also a configurable threshold, with warnings and errors displayed on a per block basis or per HMS system or a slice of HMS system. Warnings and errors may also be triggered by combinations of multiple thresholds levels.

The thresholds may be stored in their associated registers within the register set 404 or may be stored in a preset memory space within the HMS 300 or within the system comprising the HMS 300.

In addition to the communication interface, the HMS 300 may also display error and warning status visually through the use of LEDs or other display mechanisms, e.g. LCD where information is displayed text or graphics. For example, the indications may be displayed as follows:
1) A single or multiple LED of one color representing an error and a single or multiple LED of another color representing a warning or failure.
2) A single dual colored LED to represent errors with one color and warnings with the other color.
3) Multiple single or tri-colored LEDs to represent various error, failure and warning conditions.

In the event of an HMS 300 failure, these visual indications make it easier for service personnel to identify a faulty HMS within a host system comprising more than one HMS system, or to identify when a particular warning threshold has been reached.

At the system level, by configuring the failure threshold (FT), error threshold (ET), and warning threshold (WT), the end user can provide a guard band around the number of invalid blocks and thus enhance the overall system reliability and reduce the probability of a catastrophic data loss due to HMS 300 error. The user can tailor or adjust various levels of acceptable tolerance for warning, error, and failure threshold based on the overall computer system implementation, e.g. use in a mission-critical operation. Additionally, the end user can receive a preliminary indication about the health of the HMS or that a certain parameter has reached a critical level.

By configuring the symbol error threshold SET, the end user can manage and control how many symbol errors are required before marking a memory portion such as a segment, page or block invalid and thereby improving the reliability of the overall system and reducing the probability of data loss occurring due HMS errors.

Furthermore, various logical operations that can be performed using these programmable thresholds and the results can be provided as stats or control bits to an application or as part of system diagnostics and health check. Moreover, certain procedures such as multiple read or write operations may be continuously run for a specified number of cycles or time, such as to confirm or to check the number of detected errors from a specific segment, page, block or slice that are produced within a given number of operations.

It will be appreciated that while described in the context of a hybrid memory system that includes both volatile and non-volatile memory, the memory monitoring and diagnostic procedures described herein are applicable to any memory system in which progressive failures in portions of the memory occur whether due to deterioration of system level parameters such as power supply, voltage, current, temperature, or due to deterioration of the memory cells of the non-volatile memory 304 through continuous use, for example read and write operations. Thus, thresholds for tolerating and remediating errors can be programmed into any such system, for example an exclusively non-volatile memory system, to provide control and flexibility over the amount of errors and portions of invalid memory that can be tolerated for a given computer system or intended application.

In accordance with certain embodiments, despite the above thresholds and control, backup and data storage failure can still occur. For instance, system backup or data storage can fail if sufficient non-volatile memory has been declared invalid, or if power loss interrupted the backup or data storage process, or internal code failed to properly execute. It may then be desirable to determine whether any significant data has been lost, and which data has been lost.

Figure 6:
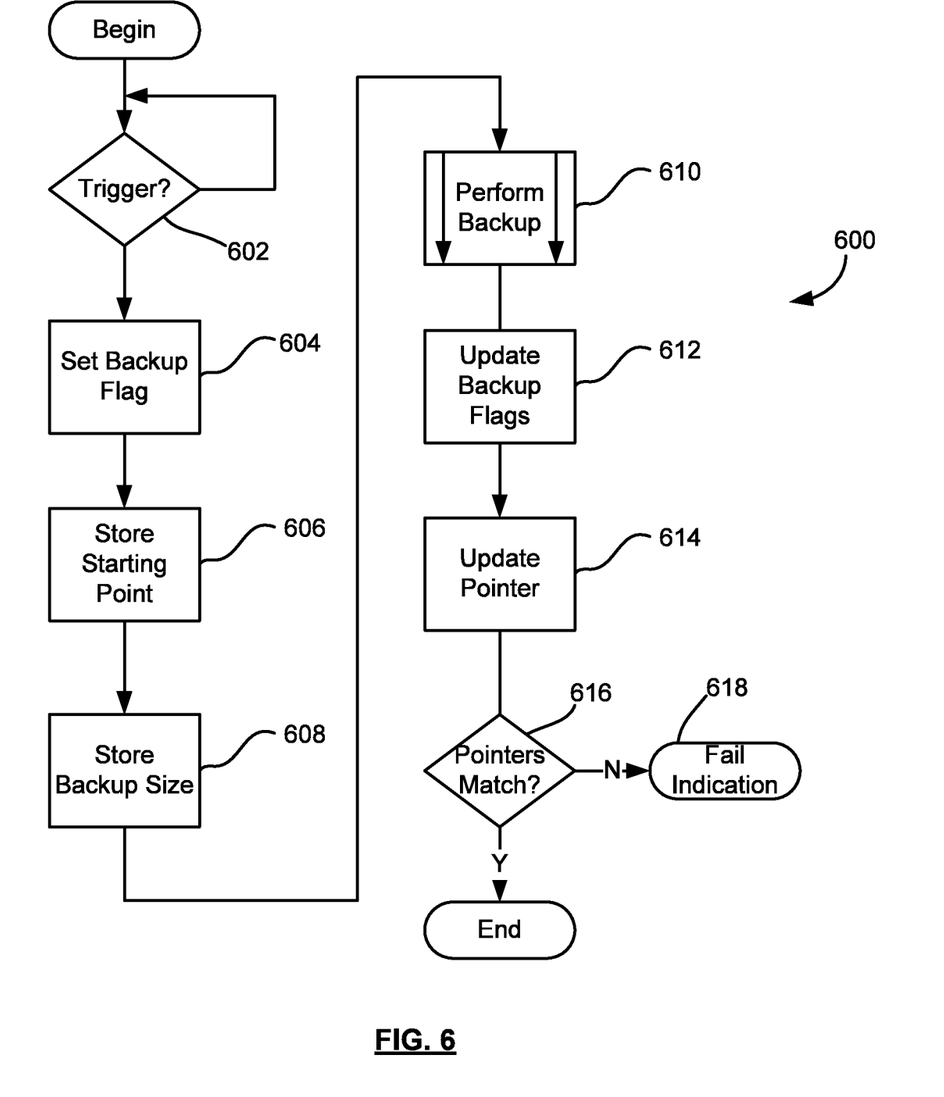
FIG. 6 is a flow diagram of a method for determining if a backup was successful.

FIG. 6 is a flow diagram of a method for determining if a backup or data storage operation was successful. In certain embodiments, method 600 is performed by HMS controller 306. Following a determination, at 602, of a trigger condition, a backup flag indicating that a backup is to take place is set, at 604. The flag may be in NVM 304 or a separate location, for example in the logic of the HMS controller 306 or in the register set 404, or at multiple locations. As discussed above, the trigger condition can be impending or onset of power loss, or a request from the host. At 606, the backup starting point in NVM 304 is stored. At 608, the size of the backup—that is, the amount of data, e.g. from the volatile memory 302 or the host, that is to be backed up in non-volatile memory 304, is stored, to provide an indication of the end point of the backup (predicted end point). The size of the backup takes into account additional data associated with error identification and correction, as discussed above, and any other metadata required to perform a successful data storage operation. The backup is then performed, at 610, by writing data into the NVM.

After the backup or data storage procedure is performed, backup or data storage flags indicating completion are updated, at 612, and a new pointer in NVM 304 is saved, at 614, to reflect how far the backup or data storage process went (actual end point). At 616, a determination is made of whether the new pointer matches up with the indication of the end point of the backup or data storage from 608. Match-up failure indicates that the backup or data storage was not successfully completed, at 618.

In certain embodiments, HMS controller 306 can conduct a backup or data storage failure analysis process following an incomplete write operation, for example to determine to the extent of the failed write operation. Since typically all memory blocks (or other portions) that make up the portions of NVM subsystem 304 that are intended to receive data must first be erased before data write can commence, remaining erased portions following backup can be used to indicate a failure of the backup to complete. Specifically, flash blocks in particular are sequential (skipping only those marked as invalid); therefore, the first block in the intended write region that is still erased, will point to where the backup fell short of completion. HMS controller 306 determines if and which blocks (or other portions) of memory 304 have remained erased after the write operation to thereby diagnose the outcome and extent of the backup.

Figure 7:
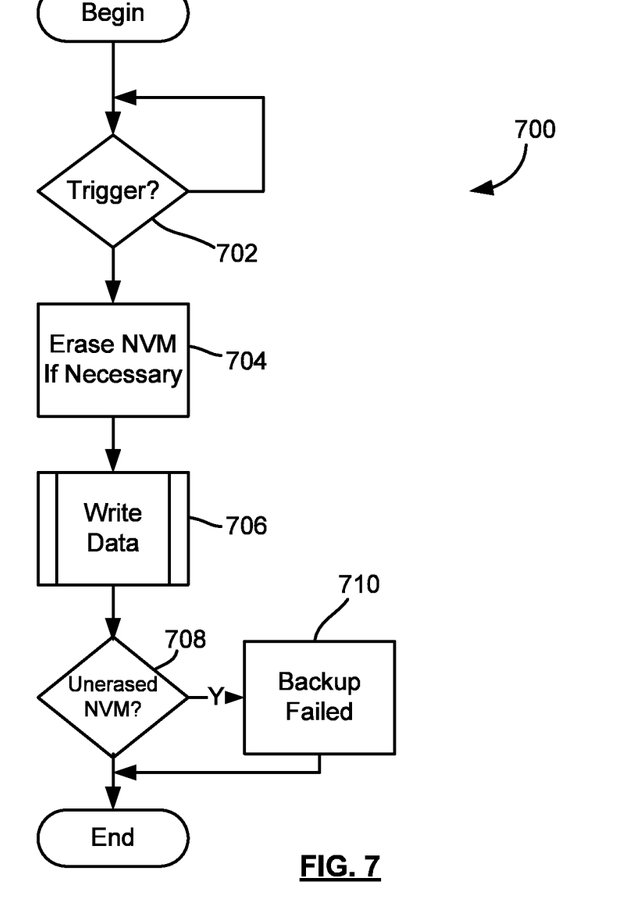
FIG. 7 is a flow diagram of a process for backup failure analysis.

With reference to FIG. 7, a process 700 for write failure analysis in accordance with certain embodiments is described. At 702, a trigger condition is detected. At 704, if a trigger condition has occurred, the non-volatile memory is erased in preparation for the new, backup data. At 706, the data from the volatile memory 302 is written into the non-volatile memory 304. At 708, the NVM is examined to determine if there is remaining erased NVM memory. If so, at 710 an indication that backup was not completed successfully is provided.

Figure 8:
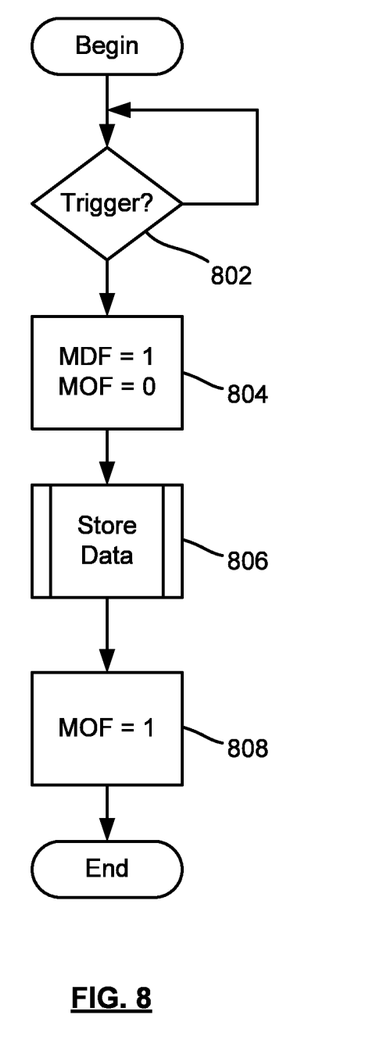
FIG. 8 is a flow diagram showing timing of flag setting relative to backup.

In certain embodiments, HMS controller 306 is configured with a count of the amount of NVM 304 required to store all of the volatile system data during backup, taking into account additional data capacity needed for error detection and correction as described above. With reference to FIG. 8, and Table 2 below, HMS controller 306 manages two non-volatile memory flags that indicate the status of the NVM 304. These flags are read during power-on initialization and written at various points during system operation. The memory dirty flag (MDF) 702 indicates the NVM 304 contains data that must be erased before it can be re-programmed—that is, written, with the backup data. The memory okay flag (MOF) 704 indicates the NVM 304 data is valid. The four relevant combinations of flag values are shown Table 2, with the last two scenarios being of particular interest to a post-backup diagnosis:

TABLE 2

| MDF | MOF | NVM Status | Next Operation |
| --- | --- | --- | --- |
| 0 | 0 | The NVM needs to be erased but does not contain valid data | Erase NVM |
| 0 | 1 | The NVM is erased and ready to be programmed | Program NVM |
| 1 | 0 | The NVM contains data, but the program operation did not complete | Set a NVM program failure indication |
| 1 | 1 | The NVM contains valid data that needs to be restored | Read NVM and restore data to volatile memory |

As explained above, in the event of system fault or power failure, or any of the aforementioned trigger conditions, backup is initiated, with HMS controller 306 programming or writing the system data from volatile memory subsystem 302 into non-volatile memory subsystem 304 until all of the volatile system data has been programmed. The operation, described with reference to FIG. 8, is as follows:

1. Detect system fault/power failure, trigger condition, user request (802)
2. Set the non-volatile flags (804)
   a. The MDF is set to "1" and the MOF is cleared to "0."
   b. In the event of a storage failure, this flag condition will indicate the failure.
3. Store the volatile system data into the non-volatile memory (806)
4. When the storage operation is complete, set the non-volatile flags (808)
   a. The MOF is set to "1."
   b. This is the last step of the storage operation and insures that all sub steps have been completed properly before the MOF is set.

When the HMS powers up after the system fault or power failure has been corrected, the non-volatile flags will be read in order to determine the system state. If the storage operation completed successfully, the MDF will be set to "1" and the MOF will be set to "1." However, in the event of failure during the storage operation, the MDF will be set to "1" and the MOF will be cleared to "0." At this point, the host system will be notified of the storage failure. This notification can take one or more of the following forms:

1. An error bit set in an error register.
2. An interrupt generated to the host system.
3. An LED lit to indicate the error condition.

Once the storage error has been identified, the NVM controller 406 can read the NVM 304 to determine how much system data was stored before the failure. The controller reads data from the memory array until a valid block is found that is in the erased state, all bits set to "1" including any bits that may be used by the error detection and correction algorithm. This distinguishes between a block of system data that is all "1" and a block that is erased. The controller can now determine how much valid data is present in the memory array.

It may be the case that the last block containing system data may only be partially programmed. This can be determined by reading the data and detecting/correcting any errors that may be present.

The controller 406 can provide access to the count of blocks (or other portions) containing system data by storing this count in a host system accessible register.

Figure 9:
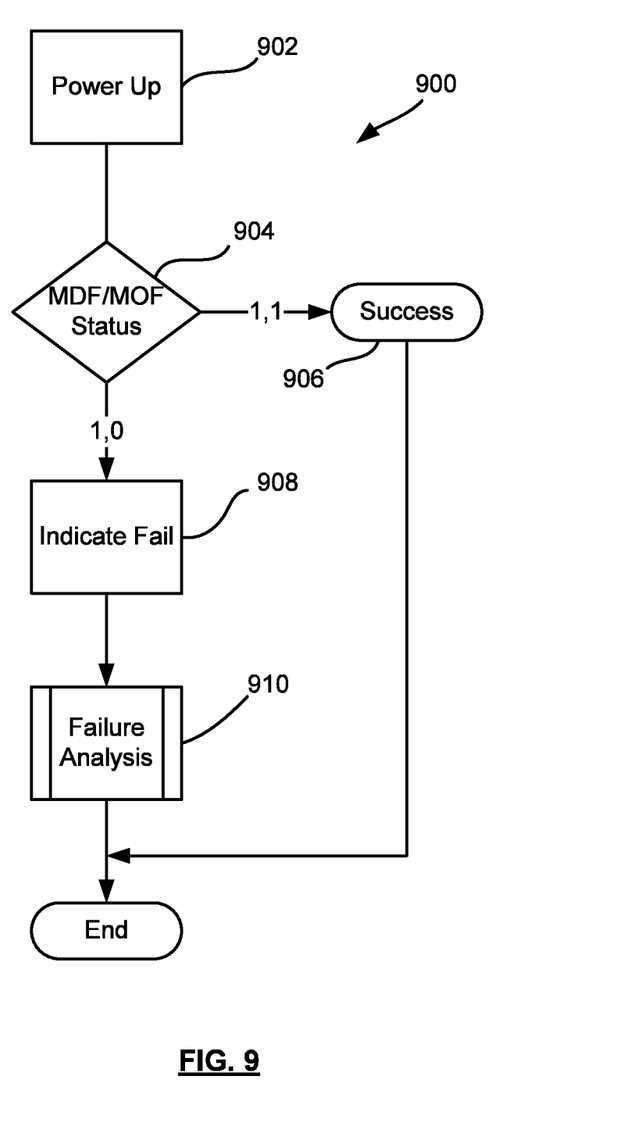
FIG. 9 is a flow diagram of a process that is followed after a trigger condition induced backup operation is performed.

Once the host system has been informed of the storage error and the amount of system data that was stored before the error occurred, the host system can determine the next steps:

1) Discard the partial data and erase the NVM array
2) Restore the valid data and erase the NVM array FIG. 9 is directed to a process 900 that is followed after a trigger condition induced backup operation is performed. At 902, the system is powered up again, when power has been restored. At 904, the MDF and MOF flags are checked. If MDF=1 and MOF=1, the backup is deemed to have been completed successfully at 906, and an indication to that effect may be provided. However, if MDF=1 and MOF=0, the backup will be deemed to have failed, and a notification accordingly may be issued, at 908. At 910, a failure analysis, as described above and for example according to FIG. 6, may be conducted.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

The invention claimed is:

1. A memory diagnostic and health check system comprising:
   a non-volatile memory (NVM) subsystem including a plurality of blocks, each block of the plurality of blocks including a plurality of pages, each page of the plurality of pages configured to store data information in a plurality of NVM cells;

a plurality of sets of programmable threshold registers, each set configured to be programmed with a respective set of threshold values including first and second threshold values respectively representing first and second programmable desired reliability levels of a first parameter of a set of parameters of the NVM subsystem; and a controller coupled to an interface, to the NVM subsystem and to the plurality of sets of programmable threshold registers, the controller configured to communicate with a host system via the interface using a protocol, the controller further configured to operate the NVM subsystem and to determine whether the first parameter of the set of parameters of the NVM subsystem has reached at least one of the first or second threshold values of the respective set of threshold values.

2. The memory diagnostic and health check system of claim 1, wherein the first and second threshold values of a first respective set of threshold values relate to first and second numbers of detectable errors or correctable errors.

3. The memory diagnostic and health check system of claim 2, wherein the first and second number of detectable errors or correctable errors is a number value that is less than a maximum number of detectable errors or correctable errors, and wherein the first number of detectable errors or correctable errors is less than the second number of detectable errors or correctable errors.

4. The memory diagnostic and health check system of claim 2, wherein the first and second threshold values of a second respective set of threshold values relate to a first and second numbers of invalid pages for a block of the plurality of blocks.

5. The memory diagnostic and health check system of claim 1, wherein each respective set of threshold values includes a third threshold value representing a third programmable desired reliability level of the first parameter of the set of parameters of the NVM subsystem.

6. The memory diagnostic and health check system of claim 1, wherein the controller is further configured to provide an indication to a user that the first parameter of the set of parameters of the NVM subsystem has reached one of the first and second programmable desired reliability levels of the first parameter of the set of parameters of the NVM subsystem.

7. The memory diagnostic and health check system of claim 6, wherein the controller is further configured to display a first color using a first LED as an indication to the user that the first programmable desired reliability level of the first parameter of the set of the NVM subsystem has been reached.

8. The memory diagnostic and health check system of claim 7, wherein the controller is further configured to display a second color using a second LED as an indication to the user that the second programmable desired reliability level of the first parameter of the set of parameters of the NVM subsystem has been reached.

9. The memory diagnostic and health check system of claim 8, wherein the first and second LEDs correspond to a single dual colored LED.

10. The memory diagnostic and health check system of claim 1, wherein the controller is further configured to provide an indication to the host system that the first parameter of the set of parameters of the NVM subsystem has reached one of the first and second programmable desired reliability levels of the first parameter of the set of parameters of the NVM subsystem.

11. The memory diagnostic and health check system of claim 1, wherein the plurality of sets of programmable threshold registers further compromise:

a plurality of programmable error registers;

a plurality of programmable status registers; and a plurality of programmable control registers.

12. The memory diagnostic and health check system of claim 1, wherein the controller is further configured to read from or write into the plurality of sets of programmable threshold registers one or more threshold values in response to communication received from the host system.

* * * * *

UNITED STATES PATENT AND TRADEMARK OFFICE
CERTIFICATE OF CORRECTION

PATENT NO. : 11,200,120 B2
APPLICATION NO. : 16/517210
DATED : December 14, 2021
INVENTOR(S) : Scott H. Milton, Jeffrey C. Solomon and Kenneth S. Post Page 1 of 1

It is certified that error appears in the above-identified patent and that said Letters Patent is hereby corrected as shown below:

In the Claims

Claim 1, Column 15, Line 2, change as follows:
each set configured to be programmed with a
Claim 1, Column 15, Line 5, change as follows:
second programmable desired reliability levels of a
Claim 1, Column 15, Line 13, change as follows:
the NVM subsystem and to determine whether a first
Claim 1, Column 15, Line 15, change as follows:
system has reached a first or a second
Claim 1, Column 15, Line 16, change as follows:
threshold values of a first set of threshold Claim 2, Column 15, Line 19, change as follows:
claim 1, wherein the first and second threshold values of the
Claim 2, Column 15, Line 20, change as follows:
first set of threshold values relate to first and Claim 4, Column 15, Line 30, change as follows:
claim 2, wherein first and second threshold values of a
Claim 4, Column 15, Line 31, change as follows:
second set of threshold values relate to first and Claim 5, Column 15, Line 35, change as follows:
claim 1, wherein each set of threshold values Signed and Sealed this
Tenth Day of May, 2022

Katherine Kelly Vidal
*Director of the United States Patent and Trademark Office*